United States Patent
Nishino

(10) Patent No.: US 11,070,748 B2
(45) Date of Patent: Jul. 20, 2021

(54) INFRARED DETECTOR, INFRARED IMAGING APPARATUS USING THE SAME, AND CONTROLLING METHOD OF INFRARED DETECTOR

(71) Applicant: FUJITSU LIMITED, Kawasaki (JP)

(72) Inventor: Hironori Nishino, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/517,738

(22) Filed: Jul. 22, 2019

(65) Prior Publication Data

US 2020/0045248 A1 Feb. 6, 2020

(30) Foreign Application Priority Data

Aug. 1, 2018 (JP) .............................. JP2018-145221

(51) Int. Cl.
- *H01L 31/0352* (2006.01)
- *H04N 5/33* (2006.01)
- *H01L 31/101* (2006.01)
- *H01L 27/146* (2006.01)

(52) U.S. Cl.
CPC ....... *H04N 5/332* (2013.01); *H01L 27/14649* (2013.01); *H01L 31/101* (2013.01); *H01L 27/14652* (2013.01); *H04N 5/33* (2013.01)

(58) Field of Classification Search
None
See application file for complete search history.

(56) References Cited

U.S. PATENT DOCUMENTS

| | | |
|---|---|---|
| 6,437,414 B1 | 8/2002 | Nishino et al. |
| 2006/0042677 A1* | 3/2006 | Fukunaga ......... H01L 31/02164 136/243 |
| 2008/0061395 A1* | 3/2008 | Tkaczyk ............... G01T 1/2985 257/443 |
| 2010/0258892 A1 | 10/2010 | Butendeich et al. |
| 2013/0076910 A1* | 3/2013 | Scott ...................... H03K 5/125 348/164 |
| 2015/0028212 A1* | 1/2015 | Wright .................. G02B 23/02 250/340 |

(Continued)

FOREIGN PATENT DOCUMENTS

| | | |
|---|---|---|
| JP | 2001-044483 | 2/2001 |
| JP | 2011-511443 | 4/2011 |

*Primary Examiner* — Alison Slater
(74) *Attorney, Agent, or Firm* — Fujitsu Patent Center

(57) ABSTRACT

An apparatus for infrared detection includes: an infrared detection element array that includes an array of a plurality of pixels, the array of the plurality of pixels being configured such that a first pixel and a second pixel are repeatedly arranged in a predetermined arrangement pattern, the first pixel being a pixel configured to respond to infrared light of a first wavelength, the second pixel being a pixel configured to respond to a second wavelength different from the first wavelength; and a readout circuit configured to be coupled to the infrared detection element array, wherein the first pixel is configured to be coupled to the readout circuit via a first connection electrode, and wherein the second pixel is configured to be coupled to the readout circuit via a second connection electrode, the second connection electrode being an electrode having a height different from that of the first connection electrode.

6 Claims, 17 Drawing Sheets

(56) References Cited

U.S. PATENT DOCUMENTS

2016/0093273 A1* 3/2016 Wang ..................... G01S 3/781
                                                    345/428
2017/0373115 A1* 12/2017 Menichelli ........ H01L 27/14658
2018/0172508 A1* 6/2018 Kotani .............. H01L 27/14669
2019/0076101 A1* 3/2019 Pan ........................ A61B 6/032
2019/0306437 A1* 10/2019 Morales Delgado ........................
                                                    G03H 1/0465

* cited by examiner $\lambda_1$ OUTPUT = PIXEL OUTPUT OF (1)

$\lambda_2$ OUTPUT = OUTPUT AVERAGE VALUE OF PIXELS A AND B $\lambda_1$ OUTPUT = PIXEL OUTPUT OF (2)

$\lambda_2$ OUTPUT = OUTPUT AVERAGE VALUE OF PIXELS A, B, C, AND D $\lambda_1$ OUTPUT = OUTPUT AVERAGE VALUE OF PIXELS A, B, C, AND D $\lambda_2$ OUTPUT = PIXEL OUTPUT OF (3)

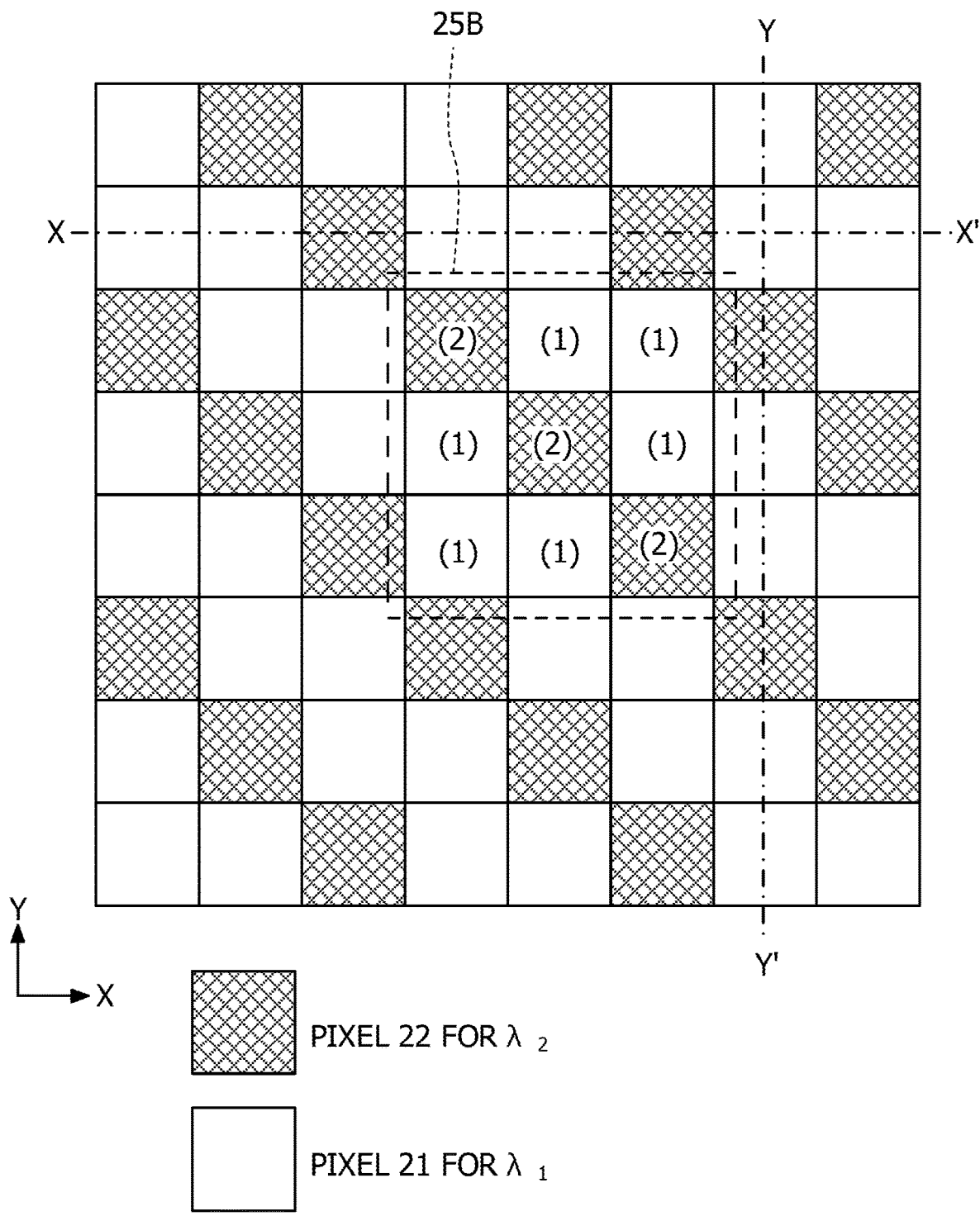

$\lambda_1$ OUTPUT = PIXEL OUTPUT OF (1)

$\lambda_2$ OUTPUT = (OUTPUT OF PIXEL A) × a
+ (OUTPUT OF PIXEL B) × b
+ (OUTPUT OF PIXEL C) × c a, b, AND c ARE CORRECTION COEFFICIENTS $\lambda_1$ OUTPUT = OUTPUT AVERAGE VALUE OF PIXELS A, B, C, AND D $\lambda_2$ OUTPUT = PIXEL OUTPUT OF (2)

INFRARED DETECTOR, INFRARED IMAGING APPARATUS USING THE SAME, AND CONTROLLING METHOD OF INFRARED DETECTOR

CROSS-REFERENCE TO RELATED APPLICATION

This application is based upon and claims the benefit of priority of the prior Japanese Patent Application No. 2018-145221, filed on Aug. 1, 2018, the entire contents of which are incorporated herein by reference.

FIELD

The embodiment relates to an infrared detector, an imaging apparatus using the same, and a controlling method for the infrared detector.

BACKGROUND

An infrared sensor has been known in which a single pixel is sensitive to different wavelength bands (for example, see Japanese Laid-open Patent Publication No. 2001-44483 and Japanese National Publication of International Patent Application No. 2011-511443).

FIG. 1 illustrates a pixel configuration of a two-wavelength element of related art. Infrared absorption layers that respond to respective different wavelength regions (λ1 and λ2) are laminated with contact layers C1, C2, and C3 interposed. Each pixel is coupled to a readout circuit by a plurality of connection electrodes BMP. With a side close to the readout circuit being an element surface, an electrode EL1 for obtaining output of a wavelength λ2, and an electrode EL2 for obtaining output of a wavelength λ1 are coupled to the element surface. An electrode EL3 for applying bias required for operating a sensor element of λ1 and a sensor element of λ2 is coupled to the contact layer C2. The electrodes EL1 and EL3 present on respective deep positions from the element surface are coupled to the element surface by a lead-out wiring $w_{leadout}$, and signal output in different wavelength bands is obtained with one pixel.

SUMMARY

According to an aspect of the embodiments, an apparatus for infrared detection includes: an infrared detection element array that includes an array of a plurality of pixels, the array of the plurality of pixels being configured such that a first pixel and a second pixel are repeatedly arranged in a predetermined arrangement pattern, the first pixel being a pixel configured to respond to infrared light of a first wavelength, the second pixel being a pixel configured to respond to a second wavelength different from the first wavelength; and a readout circuit configured to be coupled to the infrared detection element array, wherein the first pixel is configured to be coupled to the readout circuit via a first connection electrode, and wherein the second pixel is configured to be coupled to the readout circuit via a second connection electrode, the second connection electrode being an electrode having a height different from that of the first connection electrode.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is a diagram for describing pixel interpolation processing in a third embodiment;

DESCRIPTION OF EMBODIMENTS

Figure 1:
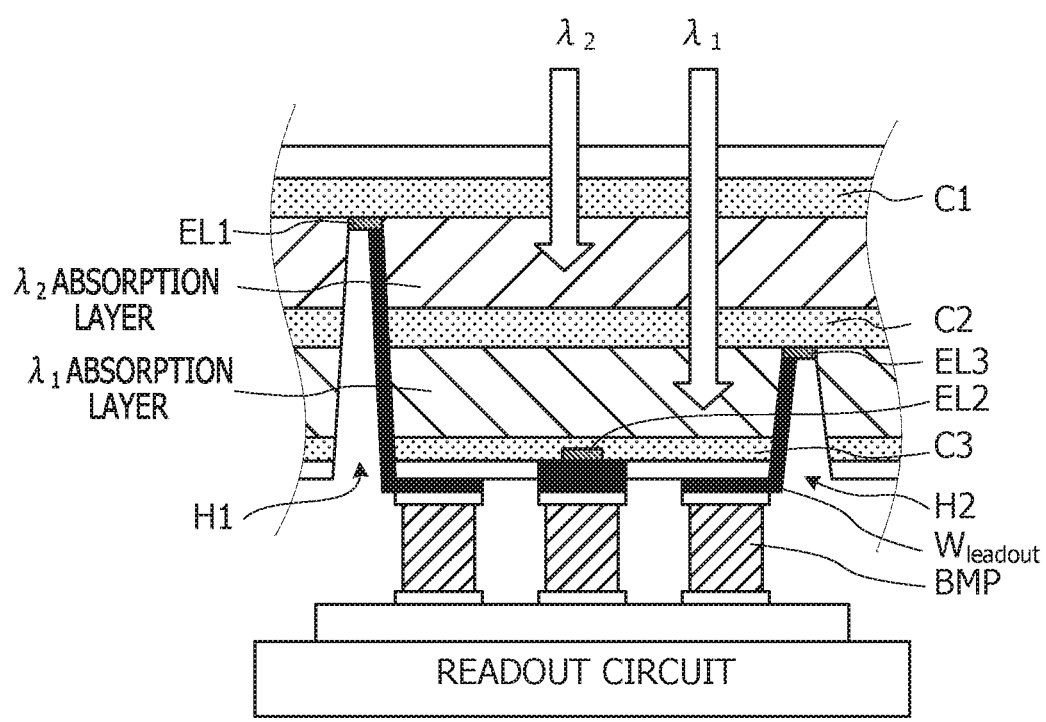
FIG. 1 is a diagram illustrating a pixel configuration of a common two-wavelength infrared sensor.
Figure 2:
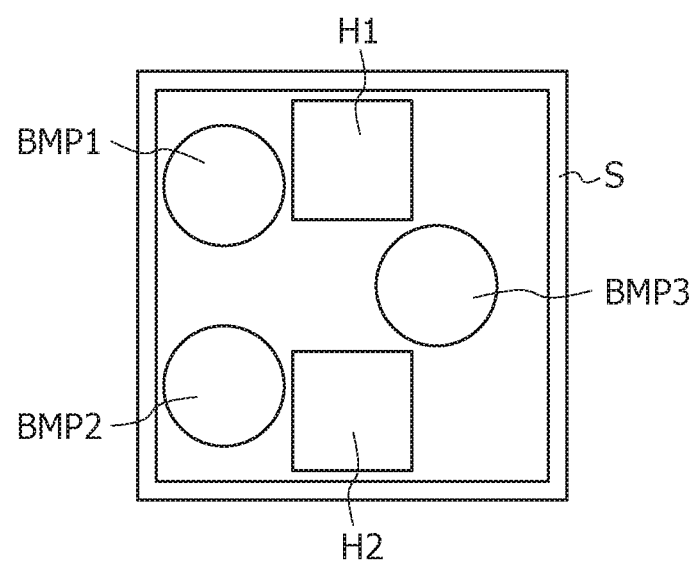
FIG. 2 is a diagram illustrating a layout inside a pixel of a two-wavelength infrared sensor of related art.

In a two-wavelength infrared image sensor of related art, a plurality of electrodes is provided inside a single pixel. Since contact holes H1 and H2 for taking out the electrode, and a lead-out wiring $w_{leadout}$ are formed, an element manufacturing process becomes complicated, and miniaturization is difficult. For example, as illustrated in FIG. 2, when diameters of the connection electrodes BMP1 to BMP3 are 5 μm, a space between the connection electrodes BMP is 3 μm, an area of each of the contact holes H1 and H2 is 5 μm×5 μm, and a width of a pixel separation groove S is 1 μm, a minimum pixel pitch that is achieved by a manufacturing process is about 19 μm. When pixel miniaturization is limited, an entire size of a pixel array increases as the number of pixels increases, and realization of a compact and high definition infrared image sensor becomes difficult.

According to an aspect of the present embodiment, in a multi-wavelength infrared detector, it is possible to maintain detection precision and reduce a pixel size.

In the present embodiment, a unit block is formed of a plurality of pixels including a pixel sensitive to at least one first wavelength, and a pixel sensitive to at least one second wavelength, and an array of the unit blocks is repeated to form a pixel array. Each pixel included in a single unit block receives light in a wavelength region to which the pixel is sensitive, and outputs charge in accordance with an amount of the received light. In each pixel, an amount of light received in the other wavelength region that is not detected is determined by being interpolated from an output value of a surrounding pixel of each pixel, so output signals of the respective two wavelengths are obtained from each pixel.

Figure 3:
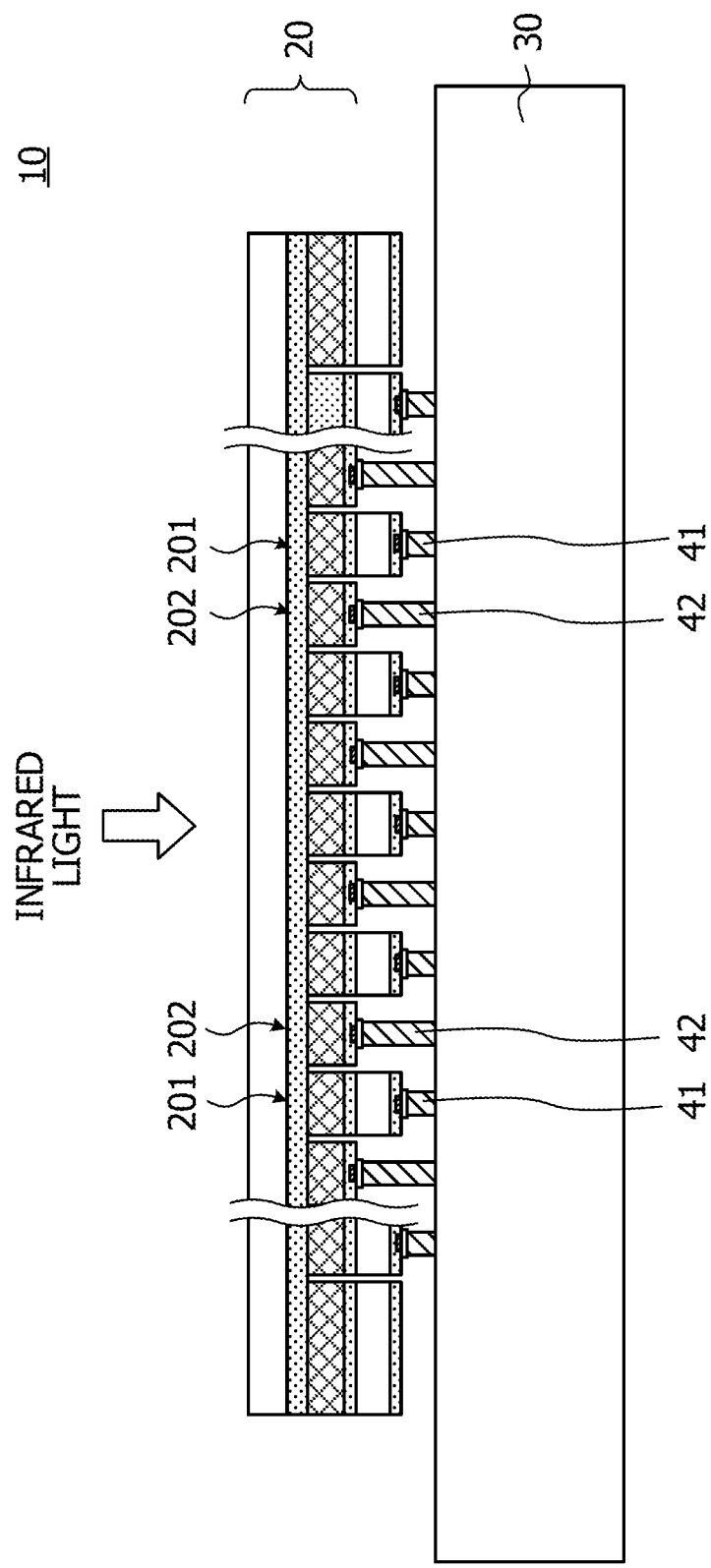
FIG. 3 is a schematic view of a cross section of an infrared detector according to the present embodiment.

FIG. 3 is a schematic view of a cross section of an infrared detector 10 according to the present embodiment. The infrared detector 10 includes an infrared detection element array 20, and a readout circuit 30 electrically coupled to the infrared detection element array 20. In the infrared detection element array 20, infrared detection elements 201 and 202 having respective different heights are arranged in a two-dimensional array, and a single pixel is formed of a single infrared detection element. Detecting infrared light emitted from an object with a plurality of the infrared detection elements arranged in the two-dimensional array makes it possible to obtain information of temperature distribution on a surface to be measured.

The infrared detection element 201 includes a single connection electrode 41, and is electrically coupled to the readout circuit 30 by the connection electrode 41. The infrared detection element 202 includes a single connection electrode 42, and is electrically coupled to the readout circuit 30 by the connection electrode 42. At least part of this infrared detection element array 20 is provided with the connection electrodes 41 and 42 having respective different heights between the elements adjacent to each other.

With a side facing the readout circuit 30 of the infrared detection element array 20 being an element surface, the infrared detection element 202 present at a position deep from the element surface is coupled to the readout circuit 30 by the connection electrode 42 having a high height. The infrared detection element 201 close to the element surface is coupled to the readout circuit 30 by the connection electrode 41 having a low height. Details of this configuration will be described later. Along circumference of the readout circuit 30, circuits such as a vertical scanning circuit (shift register), a horizontal scanning circuit (shift register), a horizontal readout circuit, and a noise canceller may be arranged.

The entire infrared detector 10 may be disposed inside a cooling container such as a dewar, for example, and maintained in a cryogenic environment. In this case, an analog output signal from the readout circuit 30 is supplied to an integrated circuit chip (digital signal processor (DSP)) for signal processing provided outside the dewar, and signal processing described later is performed. By the signal processing, signals in two different infrared wavelength regions are taken out from each pixel.

By taking the signals in the two wavelength regions out of a single pixel, it is possible to determine an absolute value of a temperature of an object to be measured from correlation of outputs of the two wavelengths, and to improve precision of temperature distribution detection. From information on received light of detected infrared light, it is possible to discriminate a reflection component of natural light from a temperature radiation component from an object itself, and thus it is possible to enhance measurement precision, compared to a single-wavelength infrared sensor.

Figure 4:
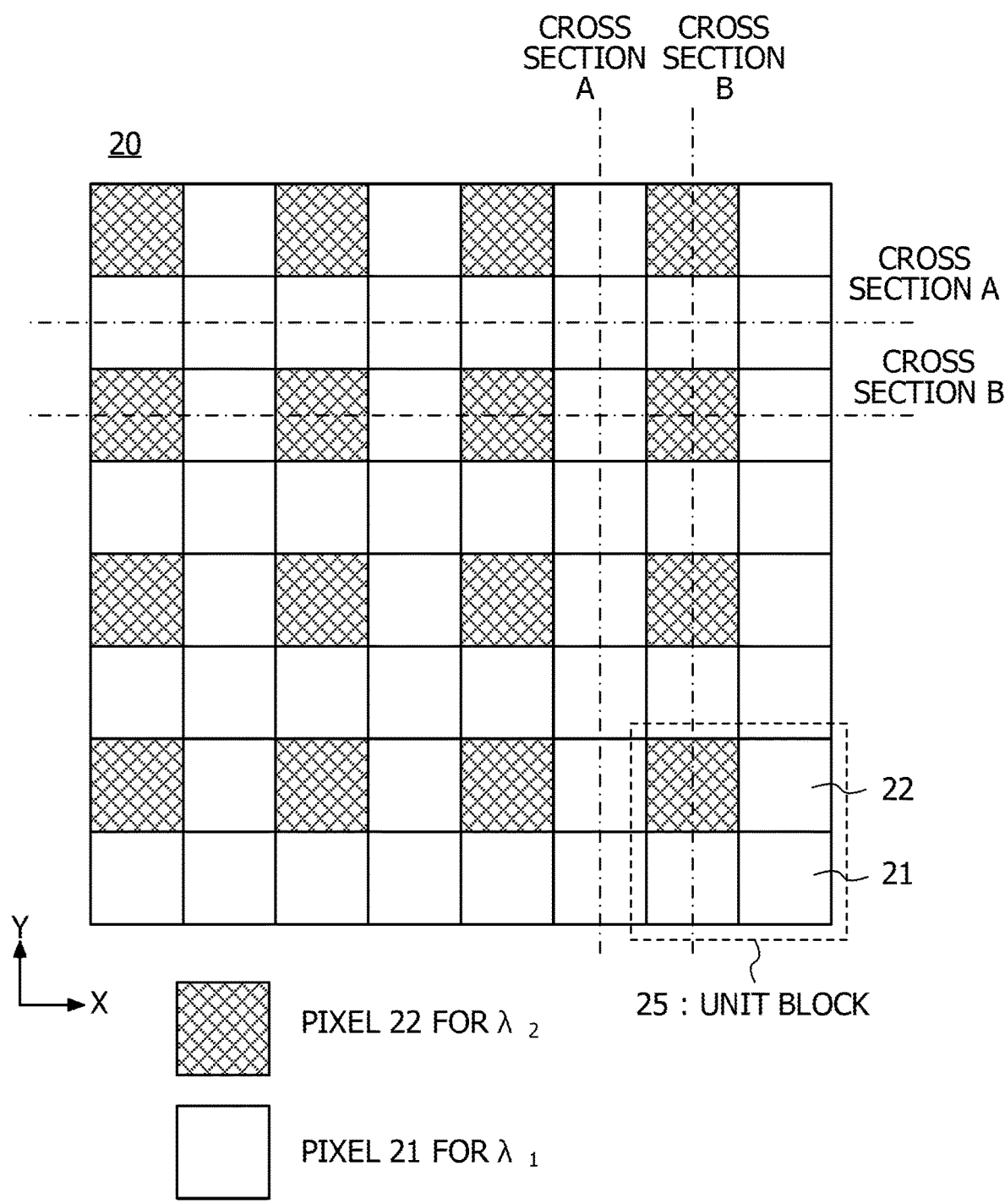
FIG. 4 is a diagram illustrating an example of a pixel arrangement of the infrared detector according to the present embodiment.

FIG. 4 is a diagram illustrating an example of a pixel arrangement of the infrared detection element array 20 according to the present embodiment. The infrared detection element array 20 is a two-dimensional array in which a plurality of pixels is arranged in a horizontal direction (X direction) and a vertical direction (Y direction). Each of the plurality of pixels is sensitive to one wavelength of the two wavelengths to be detected by the infrared detector 10. In an example that follows, a pixel responding to a first wavelength $\lambda 1$ is referred to as a "pixel 21 for $\lambda 1$", and a pixel responding to a second wavelength $\lambda 2$ is referred to as a "pixel 22 for $\lambda 2$". As an example, $\lambda 1$ is a short wavelength, and $\lambda 2$ is a long wavelength.

In the infrared detection element array 20, a unit block 25 is formed including at least one number of the pixel 21 for $\lambda 1$, and at least one number of the pixel 22 for $\lambda 2$, and the unit blocks 25 having an identical pattern are repeated to configure the array. In the example in FIG. 4, the unit block 25 is formed of four adjacent pixels, and a pixel pattern formed of one number of the pixel 22 for $\lambda 2$, and three number of the pixel 21 for $\lambda 1$ is repeated. A pixel arrangement pattern for the entire array depends on how the unit block 25 is formed. In FIG. 4, in each of the horizontal direction (X direction) and the vertical direction (Y direction), a line with only the pixels 21 for $\lambda 1$, and a line in which the pixels 21 for $\lambda 1$ and the pixels 22 for $\lambda 2$ are arranged alternately, are repeated alternately.

Figure 5A:
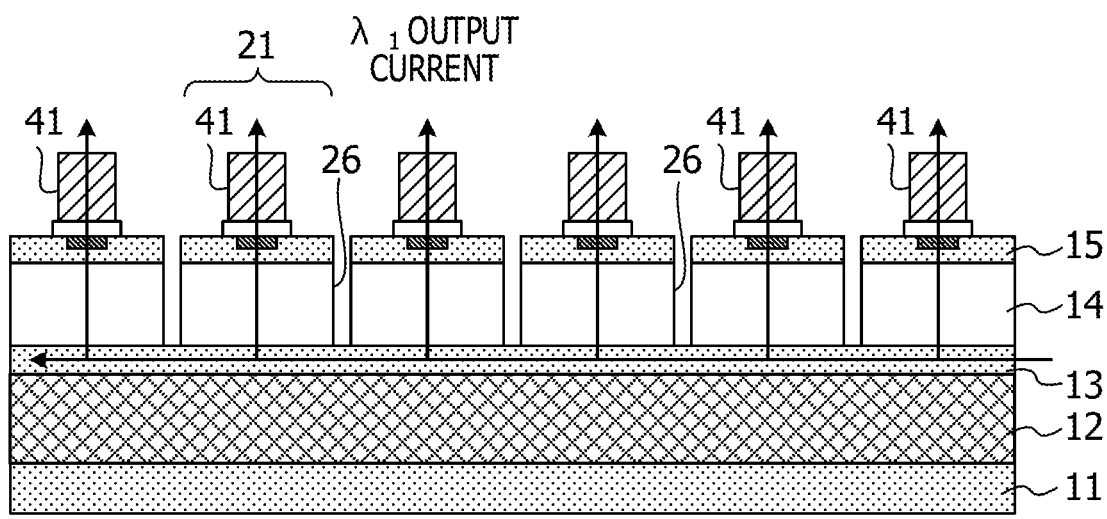
FIGS. 5A and 5B are respective schematic views of a cross section A and a cross section B in FIG. 4.
Figure 5B:
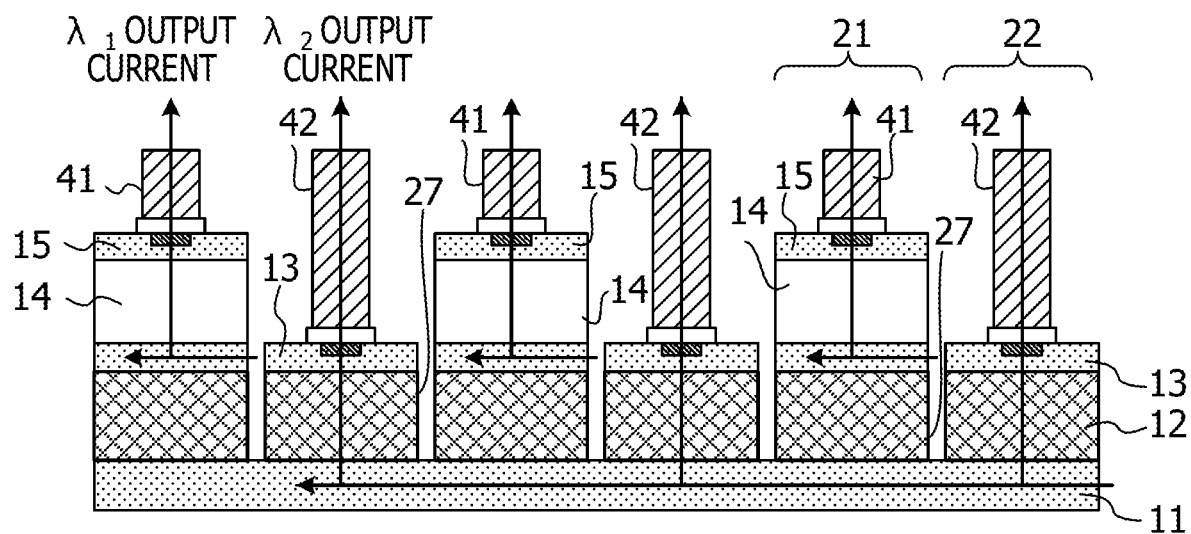

FIGS. 5A and 5B are respective schematic views of the cross section A and the cross section B in FIG. 4. FIG. 5A illustrates the cross section A in FIG. 4, and FIG. 5B illustrates the cross section B. The infrared detection element array 20 includes a multilayer body of a lower part contact layer 11, a $\lambda 2$ absorption layer 12, an intermediate contact layer 13, a $\lambda 1$ absorption layer 14, and an upper part contact layer 15. In this multilayer body, the $\lambda 1$ absorption layer 14 is partially removed in a regular pattern.

The $\lambda 1$ absorption layer 14 and the $\lambda 2$ absorption layer 12 are formed of, for example, a multi-quantum well (MQW) layer, a multi-quantum dot layer, or the like, and an infrared spectral response is obtained with a predetermined peak wavelength by light absorption due to inter-subband transition between quantum levels generated on a conduction band side of a quantum well or a quantum dot. As an example, a design may be adopted in which the $\lambda 1$ absorption layer 14 is sensitive to light in a band of 4 to 5 μm, and the $\lambda 2$ absorption layer 12 is sensitive to light in a band of 8.5 to 9 μm.

In the cross section A in FIG. 5A, the pixels 21 for $\lambda 1$ adjacent to each other are separated by a shallow pixel separation groove 26 that reaches the intermediate contact layer 13. When a detection value of each pixel on the cross section A is read out, each of the intermediate contact layer 13 and the upper part contact layer 15 is applied with a voltage, and charge excited by infrared light absorbed by the $\lambda 1$ absorption layer 14 is read out from the connection electrode 41. In this pixel line, the intermediate contact layer 13 functions as a common contact, and the $\lambda 2$ absorption layer 12 does not operate.

In the cross section B in FIG. 5B, the pixels 21 for $\lambda 1$ and the pixels 22 for $\lambda 2$ are arranged alternately, and the pixels adjacent to each other are separated by a deep pixel separation groove 27. An operation of the pixel 21 for $\lambda 1$ is identical to that in FIG. 5A, and by an electrical field generated between the intermediate contact layer 13 and the upper part contact layer 15, charge is read out from the connection electrode 41.

In the pixel 22 for λ2, a voltage is applied between the lower part contact layer 11 and the intermediate contact layer 13, and charge excited by λ2 infrared light is read out from the connection electrode 42. In this pixel array, the lower part contact layer 11 functions as a common contact.

A single pixel outputs a photoelectric current corresponding to an amount of received light of one of λ1 and λ2. This is a simple configuration in which each pixel has a single connection electrode, and thus miniaturization is easy.

Figure 6:
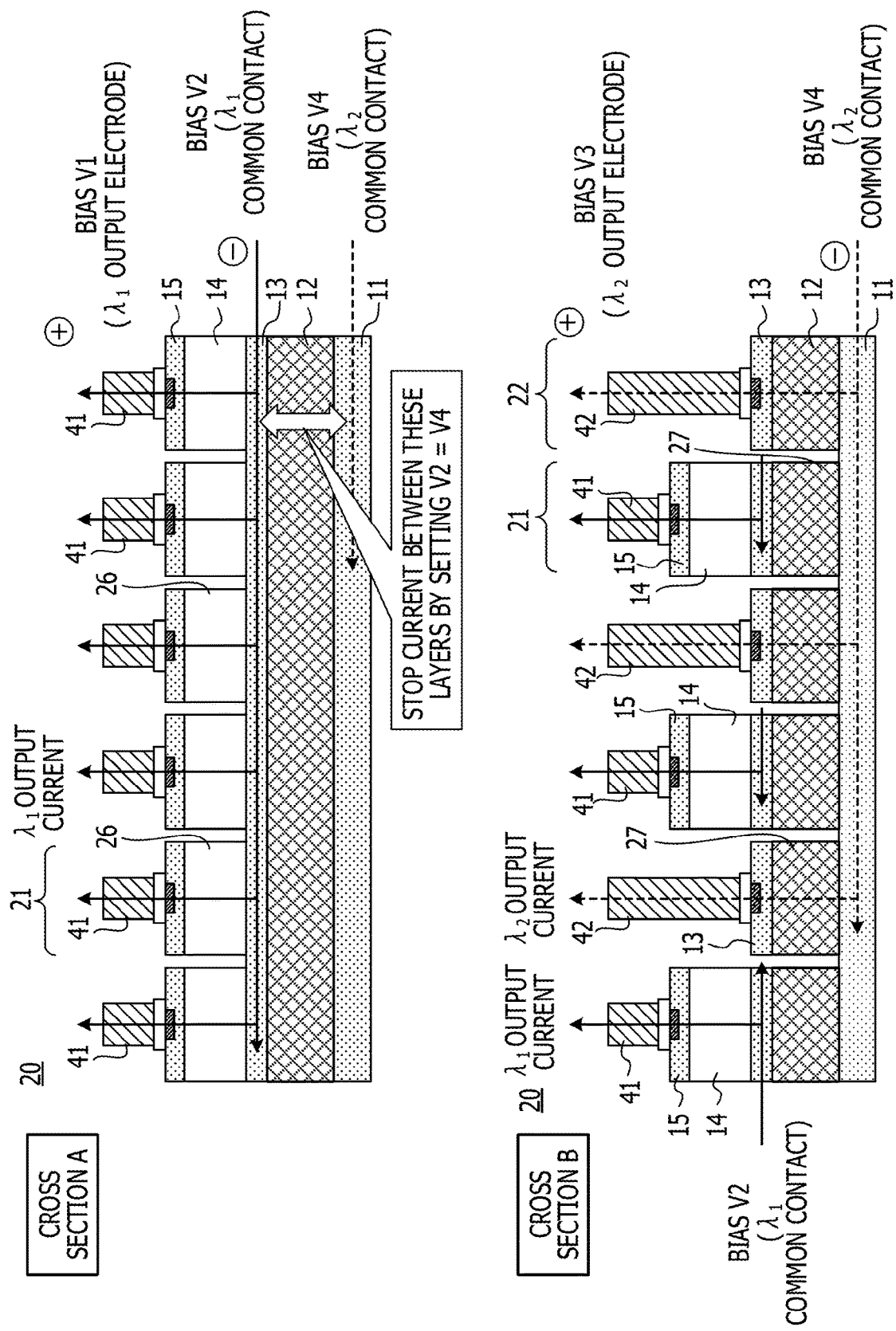
FIG. 6 is a diagram for describing setting of driving bias for an infrared detection element array according to the present embodiment.
Figure 7:
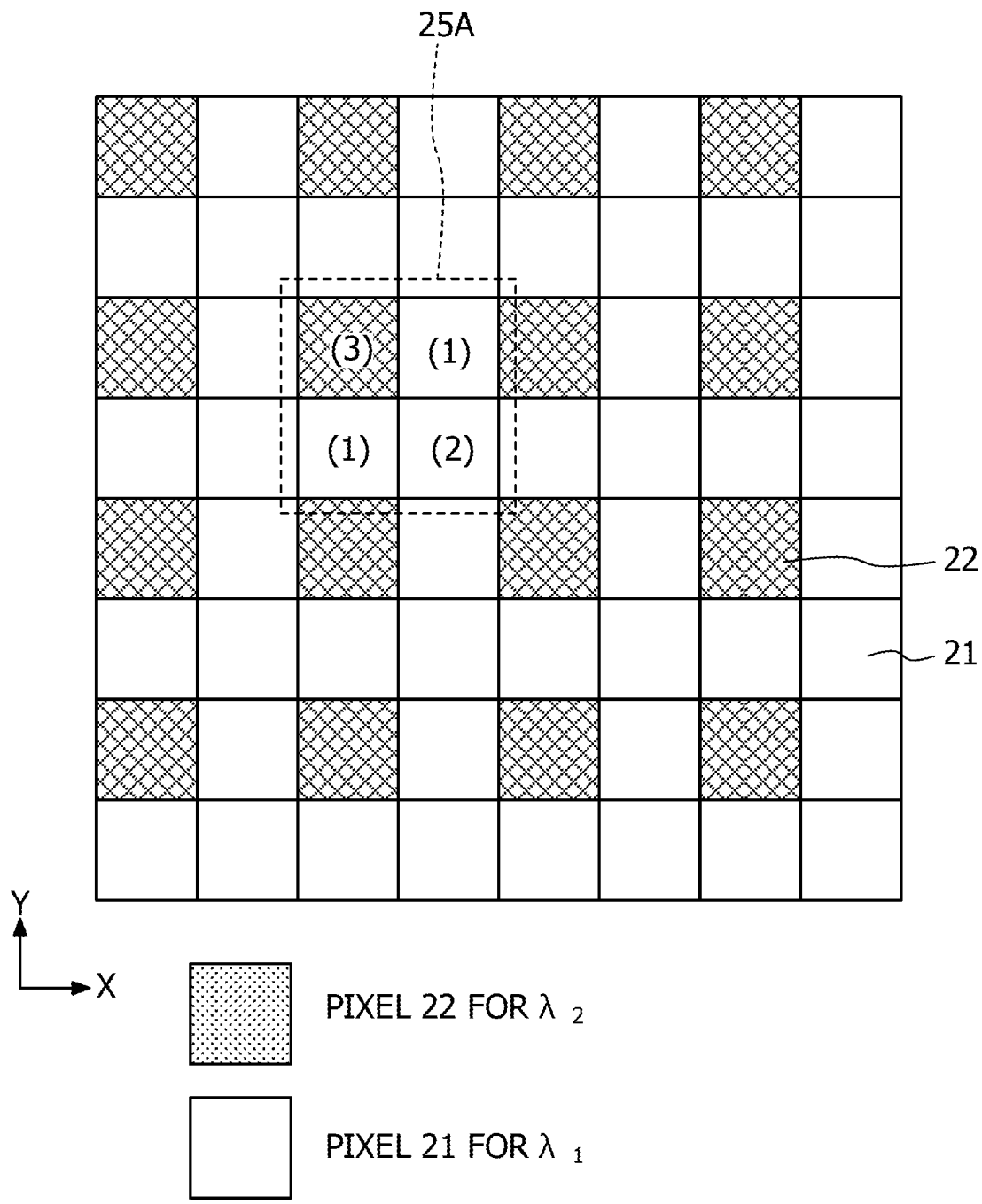
FIG. 7 is a diagram for describing pixel interpolation processing in a first embodiment.

FIG. 6 is a diagram for describing setting of driving bias of the infrared detection element array 20. In order to deactivate the λ2 absorption layer 12 on the cross section A, a bias voltage V2 applied to the intermediate contact layer 13 and a bias voltage V4 applied to the lower part contact layer 11 are set to an identical potential (V2=V4). This stops charge movement (a current) in the λ2 absorption layer 12.

A bias voltage V1 applied to the upper part contact layer 15 is made larger than V2 (V1>V2), to move charge (free electron) toward the upper part contact layer 15.

On the cross section B, a bias voltage V3 applied to the individual intermediate contact layer 13 in the pixel 22 for λ2 is set to be larger than the bias voltage V4 applied to the lower part contact layer 11 as the common contact (V3>V4). This moves charge generated in the λ2 absorption layer 12 to a side of the intermediate contact layer 13, and the charge is read out from the connection electrode 42.

The above bias setting makes it possible to individually read out amounts of received light from the pixel 21 for λ1 and the long wavelength pixel 22.

First Embodiment

FIG. 7 and FIGS. 8A to 8C are diagrams for describing pixel interpolation processing in a first embodiment. In the first embodiment, four adjacent pixels are taken as a single unit block 25A. The unit block 25A includes one number of the pixel 22 for λ2 and three number of the pixels 21 for λ1. Inside the unit block 25A, a position of the pixel 22 for λ2 is denoted by (3), a position of the pixel 21 for λ1 adjacent to the pixel 22 for λ2 in the horizontal direction (X direction) or the vertical direction (Y direction) is denoted by (1), and a position of the pixel 21 for λ1 present diagonally to the pixel 22 for λ2 is denoted by (2). In each of the pixel positions (1) to (3), an outputted current value is a detection value of a corresponding single wavelength, but in order to make the infrared detector 10 function as a two-wavelength detector, interpolation processing is performed.

Figure 8A:
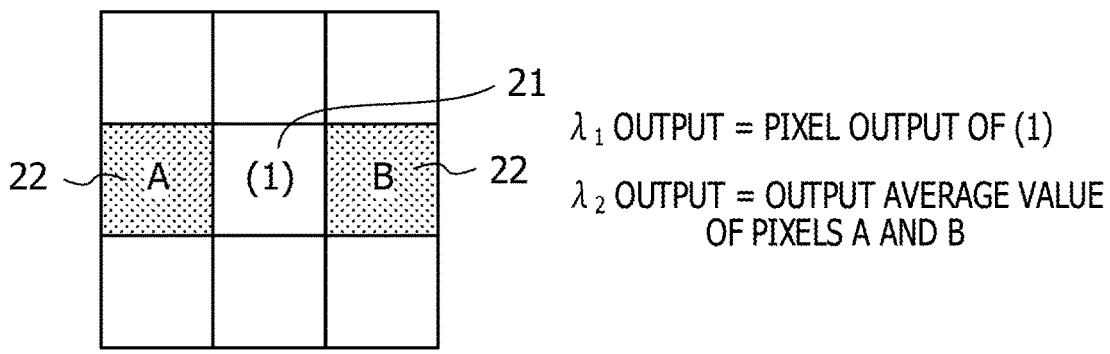
FIGS. 8A, 8B, and 8C are diagrams for describing the pixel interpolation processing in the first embodiment.
Figure 8B:
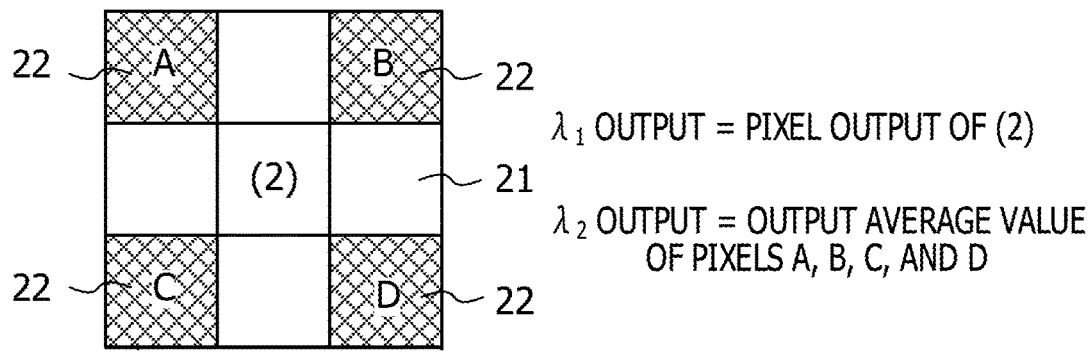
Figure 8C:
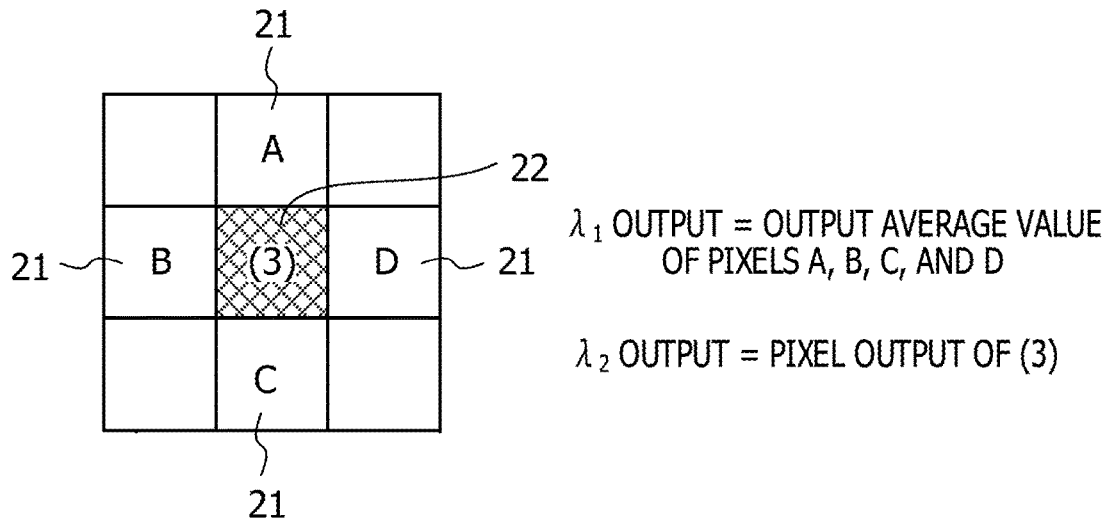

FIGS. 8A to 8C are diagrams for describing the interpolation processing performed for respective pixels at the pixel positions (1) to (3). In the pixel position (1) in FIG. 8A, as short wavelength λ1 output, an output value from this pixel 21 for λ1 is used as it is. This pixel 21 for λ1 does not output a detection value of the other wavelength λ2. Thus, as long wavelength λ2 output, an average value of a pixel A and a pixel B as the pixels 22 for λ2 adjacent to each other is used. This makes it possible to obtain the detection values corresponding to the respective two wavelengths from a single pixel.

When a pixel size or a pixel pitch is set to be larger than infrared resolution on a short wavelength side (λ1), and to be equal to or smaller than infrared resolution on a long wavelength side (λ2), λ1 light is concentrated inside the pixel 21 for λ1 at the pixel position (1) and is reflected in detection output at the pixel position (1), and thus light leakage to an adjacent pixel is small. On the other hand, λ2 incident light has a pixel pitch (size) smaller than optical resolution of this wavelength, and is not fully concentrated to a size of a single pixel, so the incident light is image-formed across a plurality of pixels. Accordingly, the λ2 incident light on the pixel position (1) is leaked out to and incident on the adjacent pixels 22 for λ2 (the two pixels, the pixel A and the pixel B in the figure). Thus, a component of λ2 incident light on the pixel position (1) is partially reflected in detection output of each of the two pixels A and B adjacent to the pixel position (1). By using this, even when detection output of λ2 is not obtained directly from the pixel 21 for λ1 at the pixel position (1), by calculating an average value of outputs of the pixel A and the pixel B adjacent to each other, it is possible to roughly estimate an incident amount of λ2 in the pixel 21 for λ1.

At the pixel position (2) in FIG. 8B, as λ1 output, an output value from this pixel 21 for λ1 is used as it is. This pixel 21 for λ1 does not output a detection value of λ2. Thus, as λ2 output of this pixel, an average value of four number of the pixels 22 for λ2 adjacent in diagonal directions (pixel A to pixel D) is used. λ2 Infrared light incident on the pixel 21 for λ1 at the pixel position (2) is not concentrated to this pixel size and incident on the surrounding pixel A to pixel D as well, and thus it is possible to estimate an incident amount of λ2 on the pixel position (2) from outputs of the pixel A to the pixel D. This makes it possible to obtain the detection values corresponding to the respective two wavelengths from a single pixel.

At a pixel position (3) in FIG. 8C, as the λ2 output, an output value from this pixel 22 for λ2 is used as it is. This pixel 22 for λ2 does not output a detection value of the short wavelength λ1. Accordingly, as short wavelength output, an average value of four number of the pixels 21 for λ1 adjacent in the horizontal direction and the vertical direction (pixel A to pixel D) is used. λ1 infrared light incident on the pixel 22 for λ2 at the pixel position (3) is considered to have intensity distribution continuous to λ1 incident light on the surrounding pixels A to D, and using a detection value of the surrounding pixels makes it possible to obtain a detection value corresponding to the two wavelengths from a single pixel.

At each pixel position, supplementing lacking wavelength output with the above-described interpolation processing makes it possible to generate output signals for two wavelengths. This realizes a multi-wavelength infrared detector that maintains detection precision and in which a pixel size is reduced.

Second Embodiment

Figure 9:
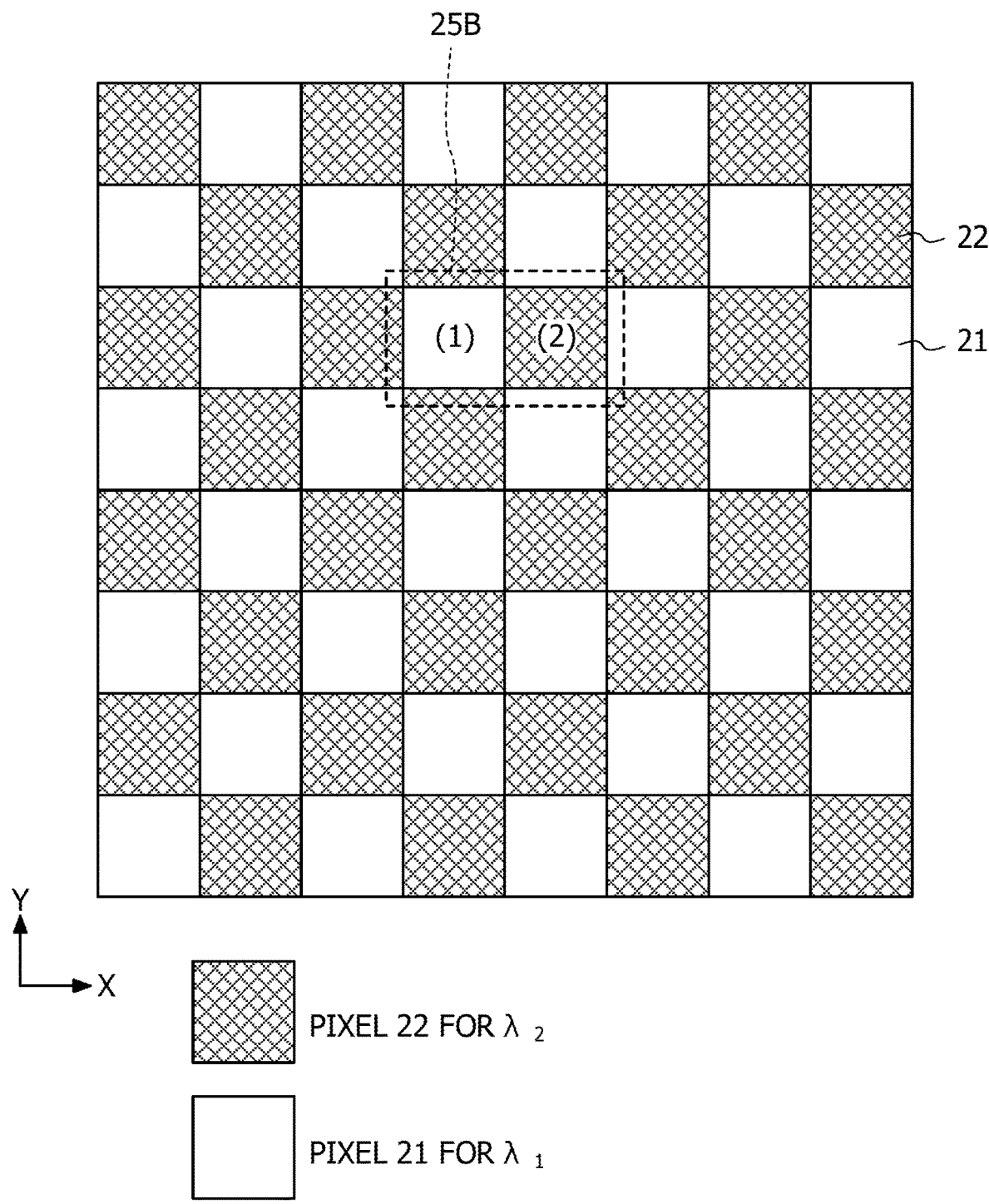
FIG. 9 is a diagram for describing pixel interpolation processing in a second embodiment.
Figure 10A:
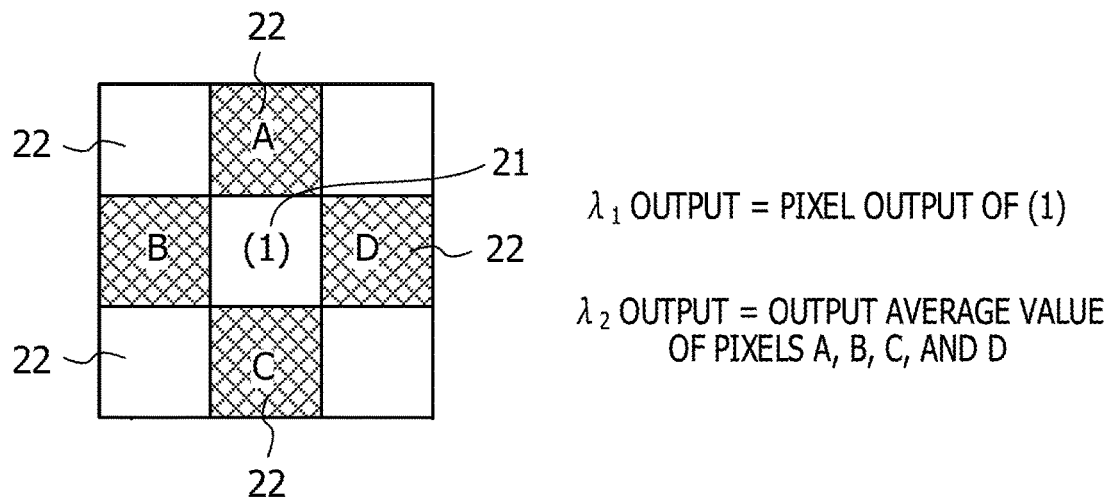
FIGS. 10A and 10B are diagrams for describing the pixel interpolation processing in the second embodiment.
Figure 10B:
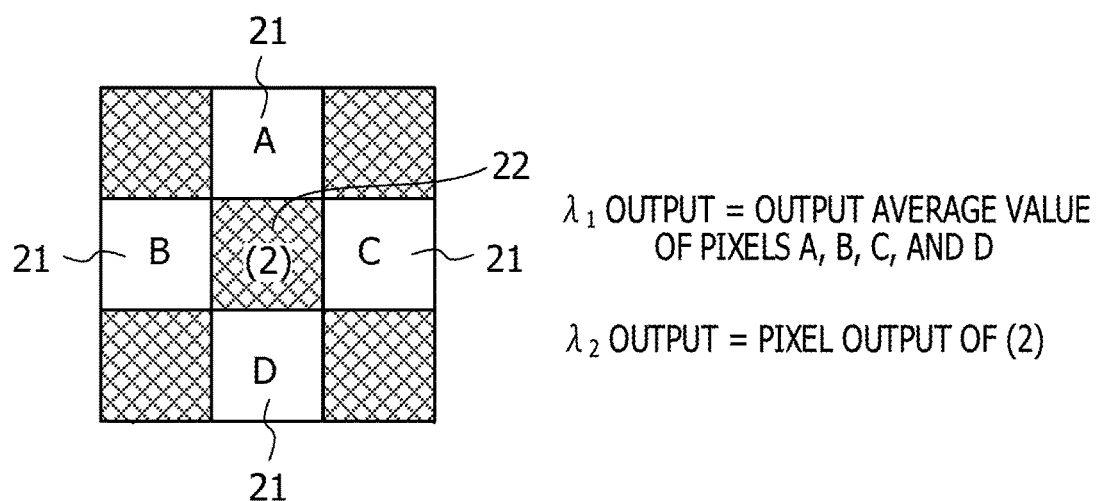

FIG. 9 and FIGS. 10A to 10B are diagrams for describing pixel interpolation processing in a second embodiment. In the second embodiment, two adjacent pixels are taken as a single unit block 25B. The unit block 25B includes one number of the pixel 22 for λ2 and one number of the pixel 21 for λ1. In this arrangement, a pixel arrangement of the infrared detection element array 20 forms a checker board pattern. In the horizontal direction (X direction) and the vertical direction (Y direction), in any row or any column, a cross section has a configuration of an alternate arrangement identical to that in FIG. 5B.

Inside the unit block 25B, a position of the pixel 21 for λ1 is denoted by (1), and a position of the pixel 22 for λ2 is denoted by (2). In each of the pixel positions (1) and (2), an outputted current value is a detection value of a corresponding single wavelength, but in order to make the infrared detector 10 function as a two-wavelength detector, interpolation processing is performed.

FIGS. 10A and 10B are diagrams for describing the interpolation processing performed for the respective pixels at the pixel positions (1) and (2). In the pixel position (1) in FIG. 10A, as short wavelength output, an output value from this pixel 21 for λ1 is used as it is. This pixel 21 for λ1 does not output a detection value of λ2. Accordingly, as λ2 output, an average value of four number of the pixels 22 for λ2 adjacent in the horizontal direction and the vertical direction (pixel A to pixel D) is used. This makes it possible to obtain the detection values corresponding to the respective two wavelengths from a single pixel.

At the pixel position (2) in FIG. 10B, as the λ2 output, an output value from this pixel 22 for λ2 is used as it is. This pixel 22 for λ2 does not output a detection value of λ1. Accordingly, as λ1 output, an average value of four number of the pixels 21 for λ1 adjacent in the horizontal direction and the vertical direction (pixel A to pixel D) is used. This makes it possible to obtain the detection values corresponding to the respective two wavelengths from a single pixel.

Third Embodiment

Figure 12A:
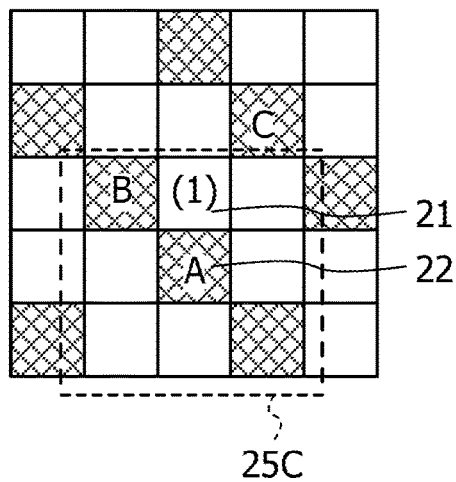
FIGS. 12A and 12B are diagrams for describing the pixel interpolation processing in the third embodiment.
Figure 12B:
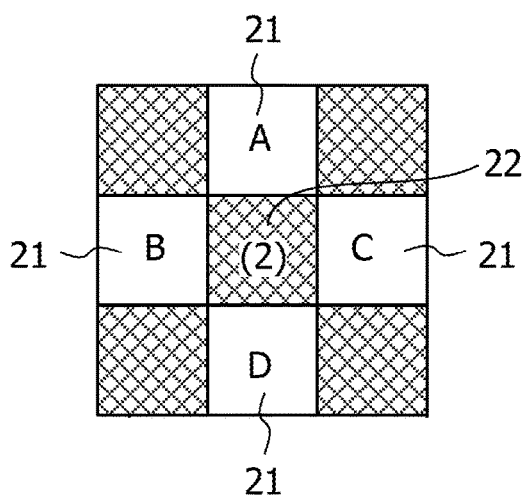

FIG. 11 and FIGS. 12A and 12B are diagrams for describing pixel interpolation processing in a third embodiment. In the third embodiment, nine pixels are taken as a single unit block 25C. The unit block 25C includes three number of the pixels 22 for λ2 aligned along a diagonal of a pixel array, and six number of the pixels 21 for λ1. A direction of the diagonal is not required to be a right-downward direction, and the alignment may be along a right-upward direction.

In this arrangement, in a pixel arrangement of the infrared detection element array 20, in the horizontal direction (X direction) and in the vertical direction (Y direction), in any row or any column, the pixel 22 for λ2 appears every three number of the pixels. In both an X-X' cross section and a Y-Y' cross section, one number of the pixel 22 for λ2 is disposed after consecutive two number of the pixels 21 for λ1.

Inside the unit block 25C, a position of the pixel 21 for λ1 is denoted by (1), and a position of the pixel 22 for λ2 is denoted by (2). In each of the pixel positions (1) and (2), an outputted current value is a detection value of a single wavelength to which the pixel at each position is sensitive, but in order to make the infrared detector 10 function as a two-wavelength detector, interpolation processing similar to the above is performed.

FIGS. 12A and 12B are diagrams for describing the interpolation processing performed for the respective pixels at the pixel positions (1) and (2). At the pixel position (1) in FIG. 12A, as λ1 output, an output value from this pixel 21 for λ1 is used as it is. This pixel 21 for λ1 does not output a detection value of λ2. Accordingly, as λ2 output, an average value of two number of the pixels 22 for λ2 adjacent in the vertical direction and the horizontal direction (pixel A and pixel B), and the pixel 22 for λ2 (pixel C) adjacent in a diagonal direction is used.

In this case, a distance from a center of the pixel position (1) on which an attention is focused to a center of a pixel for the interpolation depends on a direction. Thus, a weight coefficient may be used for calculation of the average value. For example, as an output value $I_{\lambda2}$ of a long wavelength, a value calculated using $I_{\lambda2}$=(output of the pixel A)×a+(output of the pixel B)×b+(output of the pixel C)×c may be used. When respective distances from the pixel A and the pixel B to the pixel position (1) are identical, the coefficient values may be set as a=b. The coefficient value c of the pixel C having a diagonal relation may be set such that a>c and b>c are satisfied, and an output value from the pixel that is closer to the pixel position (1) may be preferentially used.

In the pixel arrangement in FIG. 11, any of the pixels 21 for λ1 is adjacent to two number of the pixels 22 for λ2 in the horizontal direction (X direction) and the vertical direction (Y direction), and is adjacent to one number of the pixel 22 for λ2 in the diagonal direction. Thus, in all the pixels 21 for λ1, it is possible to use the above-described interpolation formula for interpolating a λ2 detection value.

At the pixel position (2) in FIG. 12B, as λ2 output, an output value from this pixel 22 for λ2 is used as it is. This pixel 22 for λ2 does not output a detection value of λ1. Accordingly, as λ1 output, an average value of four number of the pixels 21 for λ1 adjacent in the horizontal direction and the vertical direction (pixel A to pixel D) is used. This makes it possible to obtain the detection values corresponding to the respective two wavelengths from a single pixel.

In the first embodiment and the third embodiment, the number of the pixels 21 for λ1 is larger than the number of the pixels 22 for λ2, in one number of the unit block 25. When a pixel size of the infrared detector 10 is equal to or smaller than the wavelength of λ2, detection precision of λ1 becomes higher than detection precision of λ2. Setting the number of the pixels 21 for λ1 to be equal to or larger than the number of the pixels 22 for λ2 makes it possible to maintain detection precision with respect to a position of a target object such as a heat source.

Figure 13:
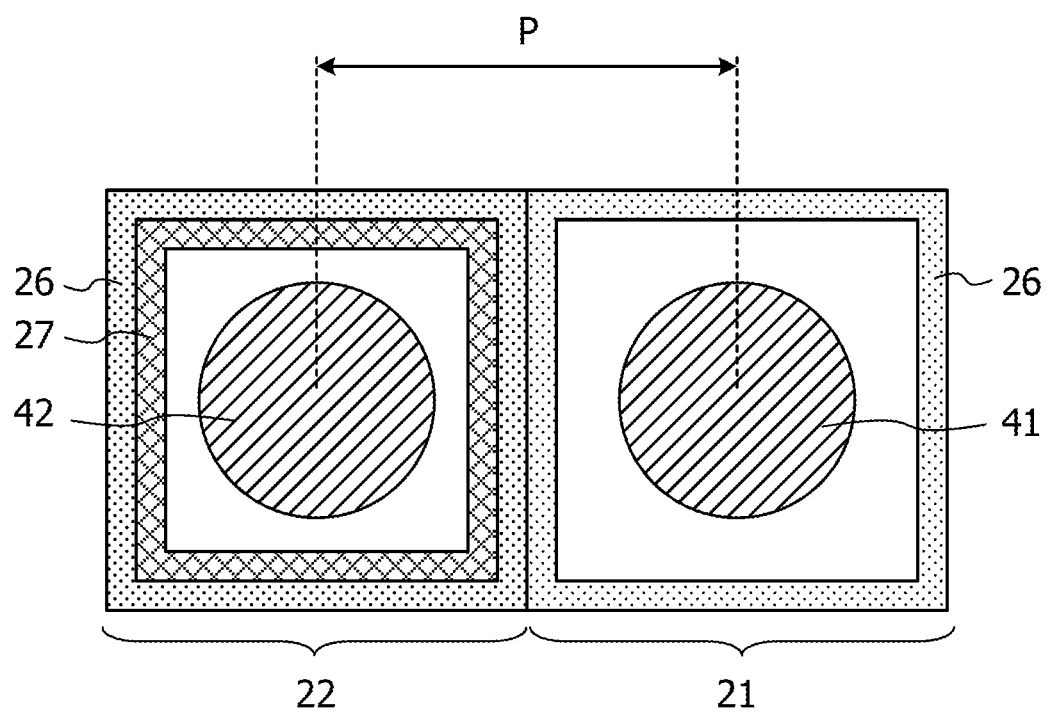
FIG. 13 is a diagram for describing effect of miniaturization of the infrared detector according to the present embodiment.

FIG. 13 is a diagram for describing effect of miniaturization of the infrared detector 10 according to the present embodiment. In the pixel 21 for λ1 and the pixel 22 for λ2 adjacent to each other, diameters of the connection electrode 41 and the connection electrode 42 are set to 5 μm, as in the configuration of related art. Unlike the configuration of related art, in the present embodiment, a single pixel has a single connection electrode. An interval (space) between the connection electrode 41 of the pixel 21 for λ1 and the connection electrode 42 of the pixel 22 for λ2 is set to 3 μm.

The pixel 21 for λ1 is partitioned by the shallow pixel separation groove 26, and the pixel 22 for λ2 is partitioned by the deep pixel separation groove 27 that is obtained by further digging the shallow pixel separation groove 26. When a width of the pixel separation groove 26 of the pixel 21 for λ1 is set to 1 μm, and a width of the pixel separation groove 27 for the pixel for λ2 is set to 1 μm, a groove width of 2 μm in total is required.

In this configuration, it is possible to reduce a pixel pitch P to 10 μm. Compared to the configuration of related art in FIG. 2, it is possible to reduce the pixel pitch P by almost half. It is possible to increase the number of elements in an identical array area by almost twice.

Figure 14:
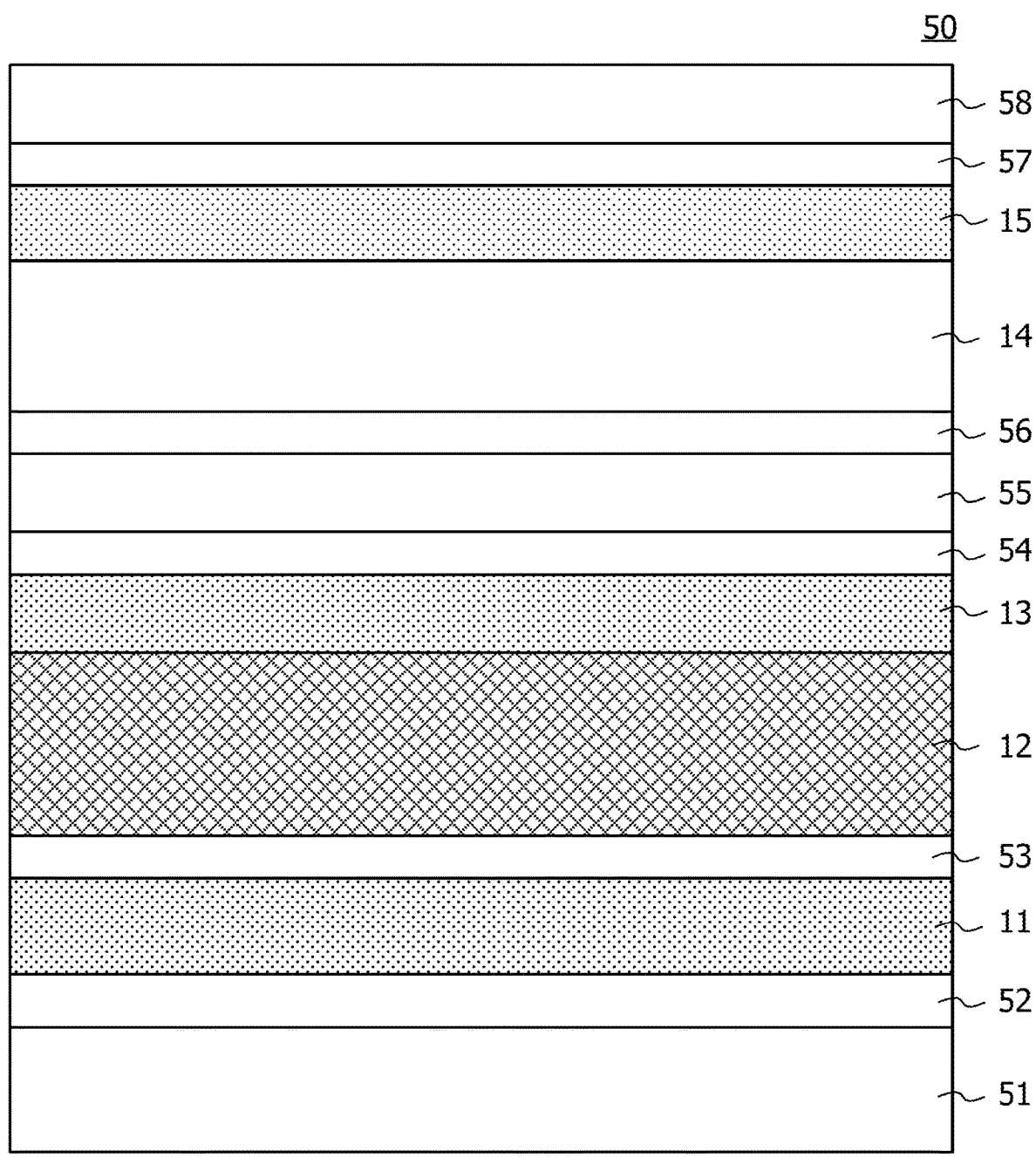
FIG. 14 is a schematic view of a multilayer body used for the infrared detection element array according to the present embodiment.

FIG. 14 is a schematic view of the multilayer body 50 used for the infrared detection element array 20 according to the present embodiment. It is possible to form the multilayer body 50 with crystal growth by a molecular beam epitaxy (MBE) method. By forming the shallow pixel separation groove 26 and the deep pixel separation groove 27 on this multilayer body 50 separately in two steps, it is possible to obtain the infrared detection element array 20 having the cross sectional shape illustrated in FIGS. 5A and 5B.

As an example, an undoped GaAs buffer layer 52 is formed on a GaAs (100) substrate 51, and an n-type GaAs contact layer, as the lower part contact layer 11, is grown so as to have a thickness of 1 μm. On the lower part contact layer 11, an etching stopper 53 is formed, and on the etching stopper 53, the λ2 absorption layer 12 is formed.

The etching stopper 53 is, for example, an InGaP layer with a thickness of 30 nm, and functions as a selective stopper layer when the deep pixel separation groove 27 is formed.

The λ2 absorption layer 12 includes, for example, multi-quantum well structure of AlGaAs/GaAs. As an example, an n-type GaAs quantum well with a thickness of 5 nm, and an i-type AlGaAs (Al composition is 0.25) layer with a thickness of 40 nm are repeated for 40 cycles. By light absorption due to inter-subband transition between quantum levels generated on a conduction band side of a GaAs well layer, an infrared spectral response having a peak wavelength of about 8.5 μm is obtained.

On the λ2 absorption layer 12, the intermediate contact layer 13 of n-type GaAs with a thickness of 0.5 μm is formed, and on the intermediate contact layer 13, an stopper layer 54 of n-type AlGaAs (Al composition is 0.3), a λ2 coupler layer 55 of n-type GaAs, and a stopper layer 56 of InGaP are sequentially formed. The stopper layer 54 has a thickness of 5 nm, and functions as an etching stopper when a diffraction grating is formed on the λ2 coupler layer 55 as an upper layer. A thickness of the λ2 coupler layer 55 is 0.7 μm, and a thickness of the stopper layer 56 is 30 nm. The stopper layer 56 of InGaP acts as an etching stopper when the shallow pixel separation groove 26 reaching the intermediate contact layer 13 is formed.

On the stopper layer 56, the λ1 absorption layer 14, the upper part contact layer 15 of n-type GaAs, a stopper layer 57 of n-type AlGaAs (Al composition is 0.3), and a λ1 coupler layer 58 of n-type GaAs are formed in this order.

The λ1 absorption layer 14 includes, for example, multi-quantum well structure of AlGaAs/InGaAs. As an example, a quantum well of n-type InGaAs (In composition is 0.2) with a thickness of 3 nm, and a barrier layer of i-type AlGaAs (Al composition is 0.3) with a thickness of 40 nm are repeated for 20 cycles. By light absorption due to inter-subband transition between quantum levels generated on a conduction band side of the InGaAs well layer, an infrared spectral response having a peak wavelength of about 5 μm is obtained.

As an example, a thickness of the upper part contact layer 15 of n-type GaAs is 0.5 μm, a thickness of the stopper layer 57 of n-type AlGaAs is 5 nm, and a thickness of the λ1 coupler layer 58 is 0.3 μm. The stopper layer 57 functions as an etching stopper when a diffraction grating is formed on the λ1 coupler layer 58.

An element formation process described below is applied to this multilayer body 50 to produce the infrared detection element array 20 including the pixel structure in FIGS. 5A and 5B.

(1) A GaAs layer on a surface to be the λ1 coupler layer 58 is etched to form a marker for pattern alignment, and a mask for the diffraction grating is formed by patterning. The stopper layer 57 of AlGaAs is used as an etching stopper, GaAs in the λ1 coupler layer 58 is processed by selective dry etching, and a diffraction grating groove is formed.

(2) The shallow pixel separation groove 26, and a mask for an area of the pixel 22 for λ2 are formed, and dry etching is performed to remove large part of the λ1 absorption layer 14 from a surface of the multilayer body 50. Wet etching is performed with the stopper layer 56 of InGaP being a selective stopper layer, and the pixel separation groove 26 reaching a surface of the intermediate contact layer 13 is formed. At this time, in an area corresponding to the pixel 22 for λ2, the λ1 absorption layer 14 is removed over the entire pixel.

(3) In the area of the pixel 22 for λ2, a mask for the diffraction grating on the λ2 coupler layer 55 is patterned, a GaAs layer of the λ2 coupler layer 55 is partially processed, and the diffraction grating on the λ2 coupler layer 55 is formed. At this time, the stopper layer 54 of n-type AlGaAs is used as an etching stopper for the diffraction grating.

(4) The deep pixel separation groove 27 is formed around the pixel 22 for λ2. The selective dry etching is performed with the stopper layer 53 of InGaP being an etching stopper, and the λ2 absorption layer 12 of a portion to be a groove is removed from an upper part of the intermediate contact layer 13.

(5) A λ1 common electrode contact hole for supplying a common bias voltage to the intermediate contact layer 13 is formed on a periphery of a two-dimensional array. The λ1 common electrode contact hole is, for example, formed by the wet etching with the stopper layer 56 of InGaP being an etching stopper.

(6) Subsequently, a contact hole reaching the lower part contact layer 11 is further formed by the wet etching, on part of the formed λ1 common electrode contact hole. This contact hole is a λ2 common electrode contact hole for supplying a common bias voltage for λ2 detection to the lower part contact layer 11, and is formed with the stopper layer 53 of InGaP being an etching stopper.

(7) In required portions, that is, in the pixel 21 for λ1, the pixel 22 for λ2, and two types of common contact holes on the periphery of the array, patterning for an ohmic electrode is performed, and an ohmic electrode of AuGe is formed by a lift-off method. In the pixel 21 for λ1, an ohmic electrode in contact with the upper part contact layer 15 is formed, and in the pixel 22 for λ2, an ohmic electrode in contact with the intermediate contact layer 13 is formed (see FIG. 5B).

(8) After an entire element surface is covered with an SiON protection film by a CVD method, the SiON protection film on a portion on which a surface electrode is to be formed is removed by the dry etching, and a Ti/Au metal film is vapor-deposited on the entire surface of the element by a sputtering method or the like. Patterning for leaving Ti/Au is performed on a surface of each pixel and a portion on which a wiring line is to be led out from a common contact electrode portion, to form the surface electrode. This surface electrode combines a reflection mirror for the λ1 coupler layer 58 and the λ2 coupler layer 55. With the reflection mirror, by returning λ1 infrared light and λ2 infrared light that have not been absorbed, to the λ1 absorption layer 14 and the λ2 absorption layer 12 respectively, absorption efficiency is enhanced.

(9) Again, the entire surface of the element is covered with the SiON protection film, a portion to be a connection electrode with the readout circuit 30 is opened, and a Ti/Pt bump base electrode is formed by the lift-off method. On the base electrode, the connection electrodes 41 and 42 of In are formed by the lift-off method.

By the above-described element formation process, the infrared detection element array 20 of a quantum well type is produced in which the pixels 21 for λ1 and the pixels 22 for λ2 are arranged in a predetermined pattern. By flip-chip coupling the infrared detection element array 20 to the readout circuit 30 by the connection electrodes 41 and 42, the infrared detector 10 in FIG. 3 is completed.

From the readout circuit 30, a bias voltage is applied using the potential relation described with reference to FIG. 6, and in the pixel 21 for λ1 and the pixel 22 for λ2, infrared sensor elements corresponding to the respective wavelengths operate.

Figure 15:
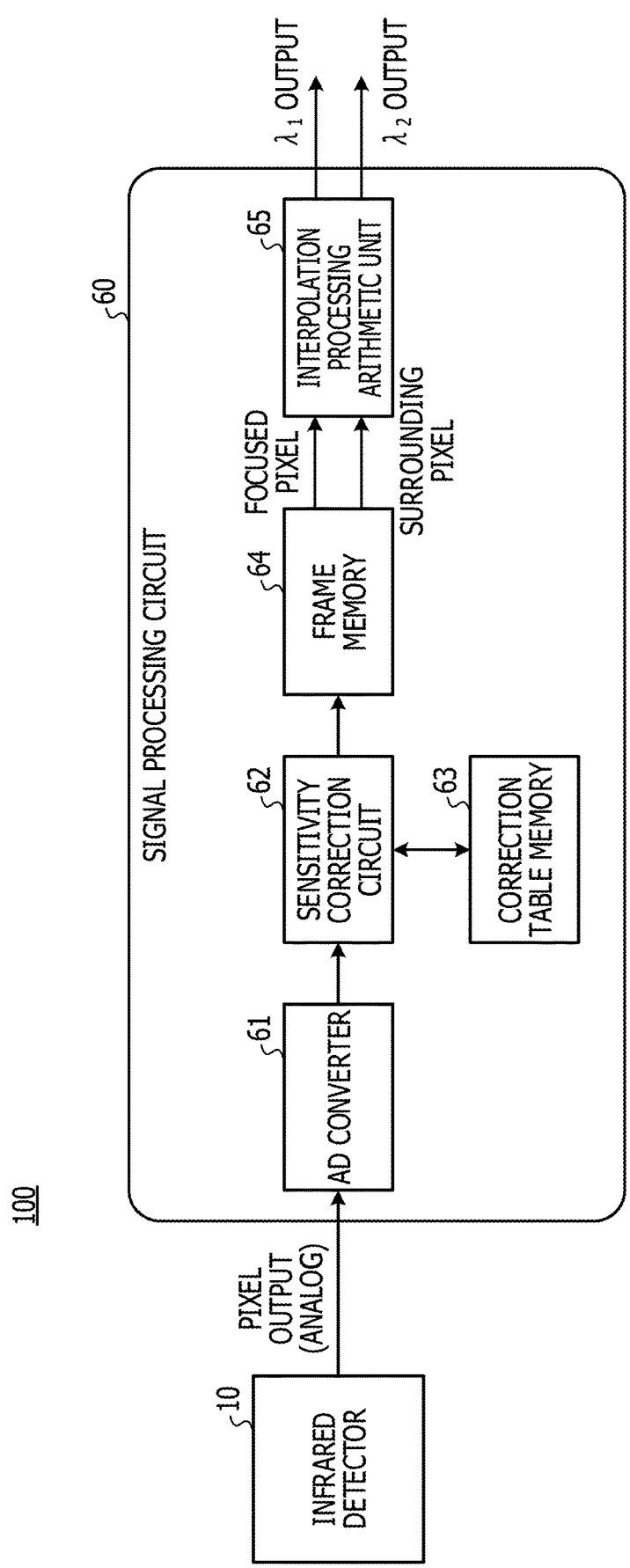
FIG. 15 is a schematic view of an infrared imaging apparatus using the infrared detector according to the present embodiment.

FIG. 15 is a schematic view of the infrared imaging apparatus 100 using the infrared detector 10. The infrared imaging apparatus 100 includes the above-described infrared detector 10, and a signal processing circuit 60 such as a digital signal processor (DSP). The signal processing circuit 60 may be incorporated in a dewar for cooling the infrared detector 10.

A charge amount sequentially read out from each pixel of the infrared detector 10 is inputted into the signal processing circuit 60 as an analog electric signal. The analog electric signal may be a signal after being subjected to processing such as noise cancelling and amplification by the readout circuit 30.

The signal processing circuit 60 includes an AD converter 61, a sensitivity correction circuit 62, a correction table memory 63, a frame memory 64, and an interpolation processing arithmetic unit 65.

The AD converter 61 samples an inputted analog electric signal with a predetermined rate, and converts the sampled signal to a digital signal. The sensitivity correction circuit 62 corrects sensitivity variation among respective pixels. Sensitivity of each pixel of the infrared detector 10 is affected by variation in photoresponsive characteristics of the infrared detection elements 201 and 202, variation in characteristics of a transistor of the readout circuit 30, and the like. The sensitivity correction circuit 62 uses a correction coefficient stored in the correction table memory 63, to correct sensitivity of signals read out from the infrared detector 10 in a time series order and subjected to digital conversion.

The correction table memory 63 stores a correction coefficient (including an offset value and a gain value) for each pixel. The sensitivity correction circuit 62 multiplies output from the AD converter 61 by a correction coefficient read out from the correction table memory 63 to correct sensitivity.

The signals with the sensitivity corrected are stored in the frame memory 64 sequentially. The frame memory stores pixel output for one frame.

The interpolation processing arithmetic unit 65 reads out, per a single pixel, an output value of the pixel, and an output value of a different wavelength of a surrounding pixel of the first-mentioned pixel from the frame memory 64, performs the arithmetic processing described with reference to FIG. 7 to FIGS. 12A and 12B, and outputs a $\lambda 1$ (short wavelength) detection value and a $\lambda 2$ (long wavelength) detection value for each pixel. The two detection values determined for each pixel may be outputted after being subjected to correlation processing, comparison processing and the like, and being converted to an image signal.

Since this infrared imaging apparatus 100 uses the infrared detector 10 being compact and with high resolution, it is possible to make the entire apparatus compact.

<Control Procedure>

Figure 16:
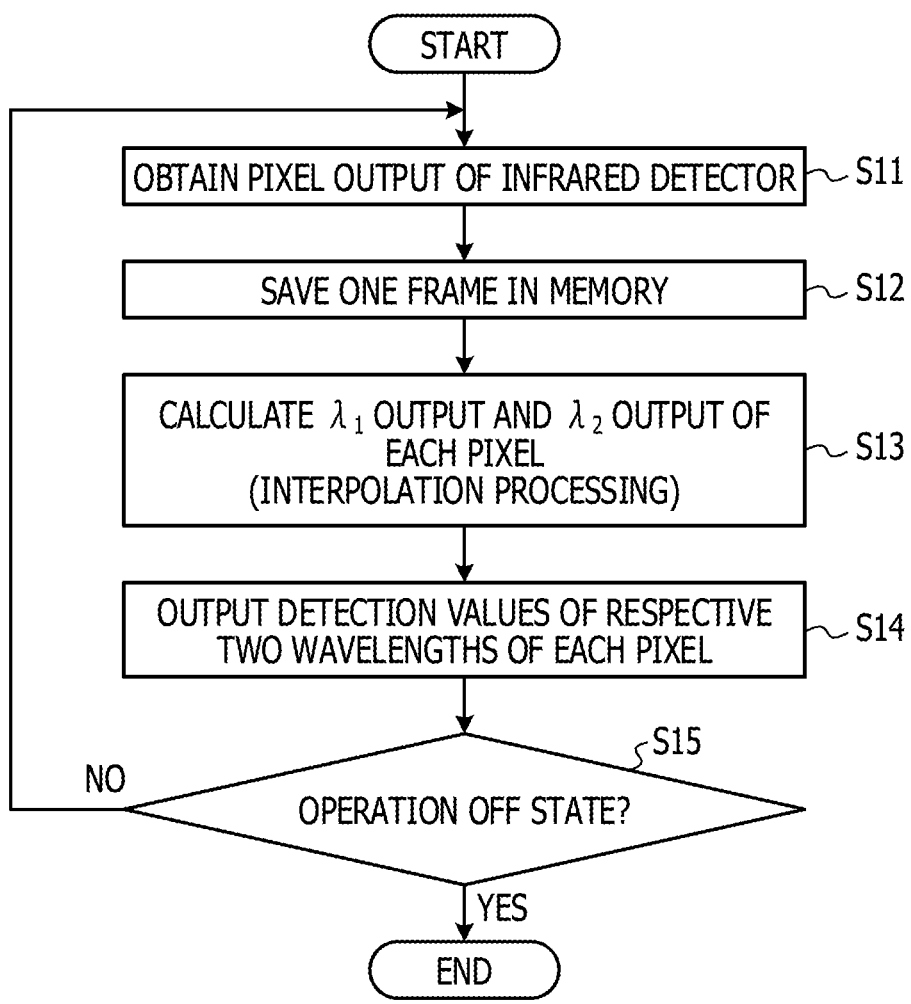
FIG. 16 is a flowchart of a control procedure performed by a signal processing circuit.

FIG. 16 is a flowchart of a control procedure performed by the signal processing circuit 60. First, pixel output from the infrared detector 10 is obtained (S11). Optical response outputs in the pixel 21 for $\lambda 1$ and the pixel for $\lambda 2$ of the infrared detection element array 20 are scanned and read out sequentially by the readout circuit 30, and are inputted into the signal processing circuit 60 as detection signals in a time series order.

The inputted detection signals are subjected to digital conversion, sensitivity correction, and the like, and are stored in the frame memory 64 for one frame (S12).

From stored pixel data for one frame, for each pixel, interpolation processing is performed using an output value of a surrounding pixel of each pixel, and a detection value of the $\lambda 1$ wavelength and a detection value of the $\lambda 2$ wavelength are calculated (S13). Contents of this interpolation processing are as described with reference to FIG. 7 to FIGS. 12A and 12B, and output corresponding to a wavelength of a focused pixel is used as a detection value of the wavelength as it is, and output of the other wavelength is estimated by an arithmetic operation from an output value of a surrounding pixel.

By setting a pixel pitch of the infrared detection element array 20 to be larger than optical resolution of one wavelength, and to be equal to or smaller than optical resolution of the other wavelength, it is possible to reflect an infrared light component that is on a long wavelength side and that is incident on an adjacent pixel, on an arithmetic operation of the other wavelength detection value of the focused pixel. Which surrounding pixel's output value is used is set in the interpolation processing arithmetic unit 65 in advance according to arrangement of the unit block 25 of the infrared detection element array 20.

For all the pixels in the frame for this time, detection values of the respective two wavelengths are outputted for each pixel (S14). Afterward, whether operation of the infrared detector 10 ends or not, that is, whether any other frame data to be processed remains or not is determined (S15), and the processes in steps S11 to S14 are repeated for each frame, until the infrared detector 10 is turned off.

This makes it possible to obtain infrared detection values of the respective different wavelengths for each pixel with a simple configuration in which a single connection electrode is provided for each pixel.

Figure 17:
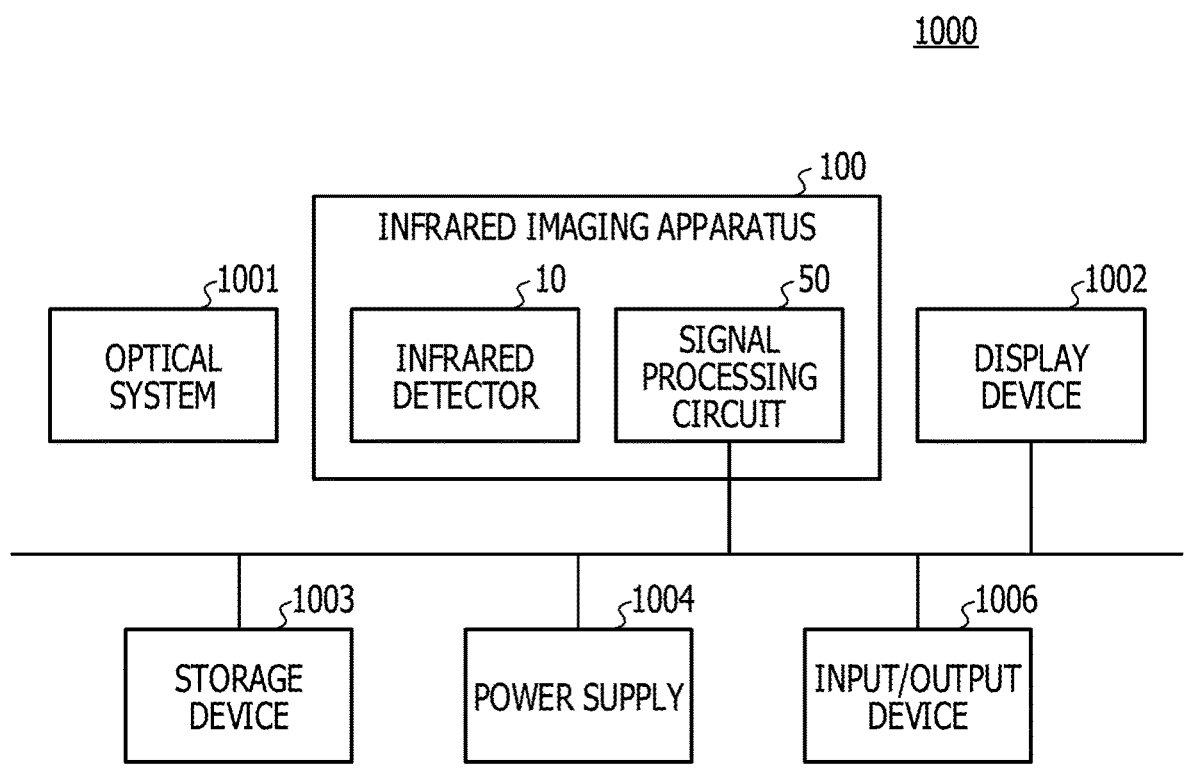
FIG. 17 is a schematic block diagram of an imaging system using the infrared imaging apparatus according to the present embodiment.

FIG. 17 is a schematic block diagram of an imaging system 1000 using an infrared imaging apparatus 100. The imaging system 1000 includes the infrared imaging apparatus 100, an optical system 1001, a display device 1002, a storage device 1003, a power supply 1004, and an input/output device 1006. The optical system 1001 includes optical elements such as a lens and a mirror, and concentrates light from an outside in the infrared detector 10 of the infrared imaging apparatus 100. In the infrared detector 10 according to the present embodiment, light is incident from a surface on an opposite side of the readout circuit 30, and thus a micro lens array may be disposed so as to face a back surface of the infrared detection element array 20.

The display device 1002 displays an image captured based on an image signal outputted from the infrared imaging apparatus 100. The storage device is a memory device such as a solid state drive (SSD), and records image data captured by the infrared imaging apparatus 100. The power supply 1004 supplies power for the entire imaging system 1000. The input/output device 1006 includes an input/output interface with external equipment.

In the imaging system 1000, the infrared imaging apparatus 100 according to the present embodiment is used, a size per one pixel is small, and infrared light is detected with the high number of pixels and a plurality of wavelengths. Since, by the signal processing circuit 60, based on an output value of each pixel and an output value of a surrounding pixel of each pixel, detection values for the two wavelengths are obtained for each pixel, it is possible to display an image of an object to be measured with high definition. This imaging system 1000 is applicable to a security system, an unmanned exploration system and the like, detects infrared light, and thus is effectively applicable to a night-time monitoring system.

As described above, the embodiment has been described with reference to the specific embodiments, but the embodiment is not limited to the configurations exemplified in the embodiments. The number of the pixels forming the unit block is not limited to 2×1, 2×2, and 3×3, but in a case of 4×4, an identical arithmetic processing to that in the case of 2×2 is used, and in a case of 5×5, an identical arithmetic processing to that in the case of 3×3 is used when the element array is viewed as a whole. In any of the cases, by setting the pixel size to be equivalent to the wavelength on the long wavelength side, or smaller, it is possible to use the information on the infrared light that is expanded from the focused pixel to the surrounding pixel and is formed as an image to perform the interpolation processing, and obtain the detection information on the two infrared wavelengths from a single pixel. It is sufficient that one number of the connection electrode with the readout circuit is provided for each pixel, and thus it is possible to reduce the pixel size and the size of the entire element array while maintaining resolution.

It is possible to make the different wavelengths λ1 and λ2 sensitive to respective desirable wavelengths, by adjusting compositions of a quantum well layer and a barrier layer, a gradual change mode of compositions, the number of repetition times, and the like, and controlling an intermediate band level. For respective layers forming an epitaxial lamination, semiconductor materials other than GaAs-based III-V compound semiconductors may be used, and a thickness of each layer is appropriately designed as required. An electrode material in ohmic contact with each contact layer is not limited to AuGe, and is appropriately selected according to a conductivity type of the contact layer. The method for forming the pixel 21 for λ1 and the pixel 22 for λ2 is not limited the above-described method, and by combining a material for an etching stopper layer having an appropriate selection ratio with respect to a layer to be etched, with an etching gas or an etchant, it is possible to process the multilayer body 50.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An apparatus for infrared detection, the apparatus comprising:
    an infrared detection element array that includes an array of a plurality of pixels, the array of the plurality of pixels being configured such that a first pixel and a second pixel are repeatedly arranged in a predetermined arrangement pattern, the first pixel being a pixel configured to respond to infrared light of a first wavelength, the second pixel being a pixel configured to respond to a second wavelength different from the first wavelength; and
    a readout circuit configured to be coupled to the infrared detection element array,
    the first pixel is configured to be coupled to the readout circuit via a first connection electrode,
    the second pixel is configured to be coupled to the readout circuit via a second connection electrode whose length is longer than a length of the first connection electrode,
    the second pixel includes a second absorption layer configured to respond to infrared light of the second wavelength,
    the first pixel includes a first absorption layer configured to respond to infrared light of a first wavelength and the second absorption layer,
    the first connection electrode is configured to detect a charge excited by the infrared light of the first wavelength,
    the second connection electrode is configured to detect a charge excited by the infrared light of the second wavelength,
    in a direction in which the first pixel and a second pixel adjacent to the first pixel are arranged, the second absorption layer included in the first pixel is separated from the second absorption layer included in the second pixel adjacent to the first pixel by a first separation groove, and
    in a direction in which the first pixel and a first pixel adjacent to the first pixel are arranged, the first absorption layer included in the first pixel is separated from the first absorption layer included in the first pixel adjacent to the first pixel by a second separation groove whose depth is shallower than a depth of the first separation groove.

2. The apparatus according to claim 1, wherein
    the infrared detection element array includes a multilayer body, the multilayer body being configured such that the first absorption layer and the second absorption layer are laminated with an intermediate contact layer interposed, the first absorption layer being configured to absorb infrared light of the first wavelength, the second absorption layer being configured to absorb infrared light of the second wavelength, and
    when an element surface of the infrared detection element array is a surface facing the readout circuit, the second pixel is configured to be located at a deeper position from the element surface than the first pixel.

3. The apparatus according to claim 2, wherein the first absorption layer is configured to be partially removed at the position of the second pixel.

4. The apparatus according to claim 1, wherein
    the infrared detection element array includes repetition of a unit block including at least one number of the first pixel, and at least one number of the second pixel,
    two of the first pixels adjacent to each other are separated by a first pixel separation groove having a first depth, and
    the first pixel and the second pixel adjacent to each other are separated by a second pixel separation groove having a second depth deeper than the first pixel separation groove.

5. The apparatus according to claim 1, wherein
    the infrared detection element array includes a multilayer body including, in order from a surface facing the readout circuit, an upper part contact layer, a first absorption layer, an intermediate contact layer, a second absorption layer, and a lower part contact layer, and
    the multilayer body is configured such that the lower part contact layer and the intermediate contact layer are applied with an identical potential of a common bias voltage.

6. An infrared imaging apparatus, comprising:
    the infrared detector according to claim 1; and
    a signal processing circuit configured to be coupled to output of the infrared detector, wherein the signal processing circuit is configured to use an output value from the first pixel, and output values from at least two of the second pixels around the first pixel, to calculate an amount of received light of the first wavelength and an amount of received light of the second wavelength in the first pixel.

* * * * *